(12) United States Patent
Rahman

(10) Patent No.: US 7,370,294 B1
(45) Date of Patent: May 6, 2008

(54) DESIGN TECHNIQUES FOR LOW LEAKAGE CIRCUITS BASED ON DELAY STATISTICS

(75) Inventor: Arifur Rahman, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 441 days.

(21) Appl. No.: 11/111,652

(22) Filed: Apr. 21, 2005

(51) Int. Cl.
*G06F 17/50* (2006.01)

(52) U.S. Cl. .............................................. 716/2; 716/6

(58) Field of Classification Search .................. None
See application file for complete search history.

(56) References Cited

U.S. PATENT DOCUMENTS 6,493,856 B2 * 12/2002 Usami et al. .................. 716/10
7,117,457 B2 * 10/2006 Frenkil ............................ 716/2

OTHER PUBLICATIONS

Anis et al., "Dynamic and Leakage Power Reduction in MTCMOS Circuits Using an Automated Efficient Gate Clustering Technique," Design Automation Conference 2002, pp. 480-485.*
Anis et al., "Design and Optimization of Multithreshold CMOS (MTCMOS) Circuits", IEEE Transactions on CAD of ICs and Systems, vol. 22, No. 10. Oct. 2003, pp. 1324-1342.*
Babighian et al., "Sizing and Characterization of Leakage-Control Cells for Layout-Aware Distributed Power-Gating", Proceedings of the Design, Automation and Test in Europe Conference and Exhibition (DATE'04), 2 pages.*
Chang et al., "Functionality Directed Clustering for Low Power MTCMOS Design", ASP-DAC Jan. 2005, pp. 862-867.*
Kao et al., "Transistor Sizing Issues and Tool for Multi-Threshold CMOS Technology", Design Automation Conference 1997, pp. 409-414.*
Kao et al., "MTCMOS Hierarchical Sizing Based on Mutual Exclusive Discharge Patterns", Design Automation Conference 1998, pp. 495-500.*
Kao et al., "Dual-Threshold Voltage Techniques for Low-Power Digital Circuits", IEEE Journal of Solid-State Circuits, vol. 35, No. 7, Jul. 2000, pp. 1009-1018.*
Khandelwal et al., "Leakage Control Through Fine-Grained Placement and Sizing of Sleep Transistors", IEEE Nov. 7-11, 2004, p. 536.*
Mukherjee et al., "Clock and Power Gating with Timing Closure", IEEE Design & Test of Computers, 2003, pp. 32-39.*
Ramalingam et al., "Sleep Transistor Sizing Using Timing Criticality and Temporal Currents", ASP-DAC Jan. 18-21, 2005, pp. 1094-1097.*

* cited by examiner

*Primary Examiner*—Leigh M. Garbowski
(74) *Attorney, Agent, or Firm*—Scott R. Brown

(57) ABSTRACT

A low-leakage circuit design method involves determining a capacity of a power gating transistor using delay statistics, wherein the resulting power gating transistor has sufficient capacity to supply all of the current necessary to meet the demands of the powered design elements while minimizing an amount of chip space required to implement the power gating transistor. The capacity of the power gating transistor is determined by first estimating a capacity necessary to meet the demands of all design elements connected to the transistor. The design elements are then grouped according to input signal arrival time to determine an amount by which the estimated capacity of the gating transistor may be reduced without affecting operation of the design elements. Various grouping schemes are evaluated to determine an optimal grouping. The estimated transistor capacity is reduced according to the optimal grouping, and the power gating transistor is implemented accordingly.

10 Claims, 4 Drawing Sheets

DESIGN TECHNIQUES FOR LOW LEAKAGE CIRCUITS BASED ON DELAY STATISTICS

FIELD OF THE INVENTION

The present invention relates to reduction in sub-threshold leakage current in deep sub-micron technology and more particularly to the use of power gating to achieve this result in CMOS IC devices.

BACKGROUND

Advances in technology have allowed manufacturers of integrated circuits to design the circuits with increasingly smaller design elements. The transistors used in digital integrated circuits to create basic design elements such as logic gates, for example, are becoming smaller and smaller. As transistors and design elements become smaller, manufacturers are able to design and build integrated circuits with much higher densities of design elements and, thus, more functionality.

Increasing the density of design elements presents certain challenges. Each design element in a digital circuit, for example, has associated with it a leakage current. Leakage current, as the name implies, is undesired current that flows through a design element. A metal oxide semiconductor field effect transistor (MOSFET), for example, in theory requires no current flow to activate or deactivate. However, the silicon dioxide that functions as gate insulation is not a perfect insulator, and therefore allows some current to seep through as "leakage current." Although the leakage current associated with a single MOSFET may be as small as a few picoamperes, the combined leakage current of millions of MOSFETs can consume as much as twenty percent of a chip's total power budget. Furthermore, leakage current can vary depending on the temperature of the circuit, increasing rapidly—even exponentially—with the temperature of the circuit, making it more difficult for engineers to account for it. This undesired and fluctuating power consumption can severely impede a designer's ability to maximize circuit efficiency and performance.

One method of controlling the amount of leakage current in digital integrated circuits involves "power gating," or "switching off" power to design elements that are not in use. FIG. 1 illustrates an exemplary prior art circuit employing power gating, wherein a MOSFET 2 serves as a power gate to a standard logic gate 4, wherein the logic gate 4 may comprise, for example, a series of MOSFETs or other primitive design elements. When the logic gate 4 is not in use, a sleep signal connected to a gate of the MOSFET 2 is asserted to switch the MOSFET "off" and prevent current from flowing to the logic gate 4. Thus, when the sleep signal is asserted current is prevented from flowing to the primitive design elements of the logic gate 4 and, therefore, leakage current is eliminated.

Power gating also presents challenges because the capacity of the gating transistor must be optimized. If the transistor is too big or "wide," for example, it will occupy an unnecessarily large portion of the available chip area and thus reduce the total number of design elements that may be placed on the chip. Furthermore, the wider the transistor, the higher the leakage current through it, which limits the transistor's effectiveness to reduce leakage current in the power-gated circuit in standby mode. If the gating transistor is too small or "narrow," it will limit the amount of drive current available to the design elements which could hinder the performance of the chip.

Therefore, a need exists for a method of determining a capacity of a gating transistor such that the transistor is capable of supplying sufficient operating current while occupying a minimal amount of chip area.

SUMMARY

Various embodiments of the present invention solve the above-described problems and provide a distinct advance in the art of low leakage circuits. More particularly, an exemplary embodiment of the invention provides a method of determining a capacity of a power-gating transistor using delay statistics, wherein the resulting gating transistor is capable of supplying all of the current necessary to meet the demands of the powered design elements while minimizing the amount of chip space required to implement the power-gating transistor.

A first embodiment of the invention involves a method of reducing leakage current in an electrical circuit comprising the steps of determining a switching time for each of a plurality of design elements of the circuit, and connecting a power-gating element to each of the design elements, wherein a capacity of the power-gating element is based on the switching times and is less than a total demand of the design elements.

In a second embodiment, the invention involves a computer-readable medium encoded with a computer program for enabling a computer to reduce leakage current in the electrical circuit, the computer program comprising code segments for determining the switching time for each of the plurality of design elements of the circuit, and connecting the power-gating element to each of the design elements, wherein the capacity of the power-gating element is based on the switching times and is less than a total demand of the design elements.

A third embodiment of the invention involves a method of reducing leakage current in an integrated circuit by determining a width of a power-gating transistor based on delay statistics. The method comprises the steps of determining a block of logic gates within an integrated circuit such that all logic gates in the block are connected to a single power-gating transistor, estimating a maximum width of the power-gating transistor based on a maximum power consumption of the block of logic gates, and determining a signal arrival time for each of a plurality of logic gates of the block.

A plurality of groups of logic gates is then determined according to a first grouping scheme, wherein each group is formed based on signal arrival times, and a first reduction amount is calculated representing an amount the width of the gating transistor may be reduced based on the first grouping scheme. A plurality of groups of logic gates is determined according to a second grouping scheme, wherein each group is formed based on signal arrival times, and a second reduction amount is calculated representing an amount the width of the gating transistor may be reduced based on the second grouping scheme. The estimated width of the power-gating transistor is then reduced by an amount equal to the greater of the first reduction amount or the second reduction amount.

These and other important aspects of the present invention are described more fully in the detailed description below.

BRIEF DESCRIPTION OF THE DRAWINGS

The skilled artisan will understand that the drawings, described below, are for illustration purposes only. The drawings are not intended to limit the scope of the present teachings in any way.

DESCRIPTION OF VARIOUS EMBODIMENTS

Reference will now be made in detail to some embodiments of the present invention, examples of which are illustrated in the accompanying drawings. Wherever possible, the same reference numbers are used throughout the drawings to refer to the same or like parts.

Figure 1:
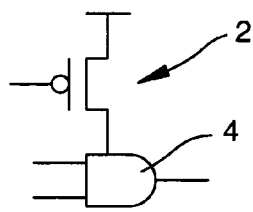
FIG. 1 is a circuit schematic diagram illustrating a prior art simple power-gated circuit, wherein a logic gate is connected to a power-gating transistor.
Figure 2:
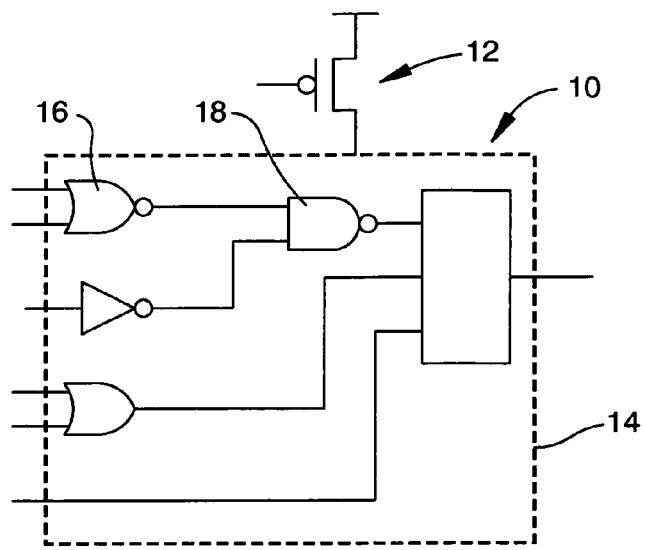
FIG. 2 is a circuit schematic diagram illustrating a more complex power-gated circuit, wherein a group of logic gates is connected to a power-gating transistor.

Referring initially to FIG. 2, an integrated circuit schematic 10 is shown that illustrates a power-gating transistor 12 connected to a block of circuit design elements 14. The power-gating transistor 12 a metal oxide semiconductor field effect transistor (MOSFET) that regulates power flow to the entire block of design elements 14 in response to a signal communicated to a gate of the transistor 12, as explained above. The capacity, and thus the physical size, of the power-gating transistor 12 depends on the amount of power consumed by the block of circuit design elements 14. Each design element within the block 14 will typically comprise a number of transistors, such as MOSFETs, wherein some transistors are referred to as "pull-up" transistors and connect to a high voltage source; and some transistors are referred to as "pull-down" transistors and connect to a low voltage source, such as ground.

The amount of current consumed by the block of circuit design elements 14 depends on the number of transistors in the block. In digital circuits, transistors are primarily used as switches and therefore consume the most current when they are switching states, that is, when the signal communicated to the gate is changing from a "high" state to a "low" state, or vice-versa. A MOSFET consumes only negligible current while remaining in a single state. Transistor gates may be connected to an input of a design element, such as an input of a logic gate, or may be connected to a drain and/or source of another transistor or transistors. As illustrated in FIG. 2, signals communicated to design elements of the block 14 travel paths of various lengths, and some signals propagate through a first design element before reaching a second design element. Thus, transistors in a first gate 16 are switched earlier in time than transistors in a second gate 18.

Because the required capacity of the power-gating transistor 12 depends on the amount of current consumed by the transistors that make up the block of design elements 14, one approach to designing the gating transistor 12 involves calculating a total amount of current that would be consumed by the block of design elements 14 if all transistors of the block were to change states simultaneously. While this approach would ensure that the gating transistor 12 had sufficient current capacity to supply the entire block of design elements 14, it results in a gating transistor 12 with excess current capacity because all transistors of the design block 14 do not change state simultaneously. This design approach, then, results in a power-gating transistor 12 that has excess capacity, and thus occupies more chip space than is necessary.

Figure 3:
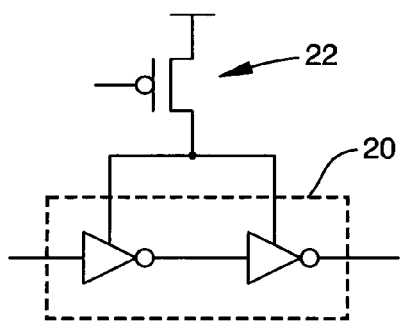
FIG. 3 is a circuit schematic diagram illustrating a simple power-gated circuit, including a power-gating transistor connected to a buffer presenting a single signal input.
Figure 4:
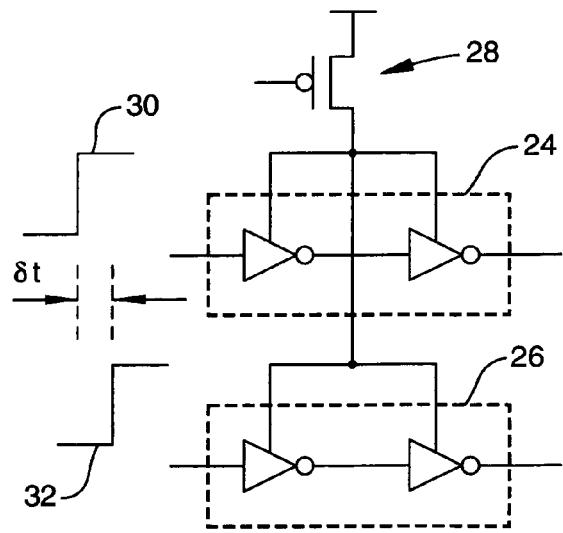
FIG. 4 is a circuit schematic diagram illustrating a power-gated circuit, including a power-gating transistor connected to two buffers, wherein a difference in signal arrival times between the two buffers is represented by the symbol "δt"

FIGS. 3 and 4 more clearly illustrate how design elements may switch states at different times. A simple digital circuit including a buffer 20 and a power-gating transistor 22 is shown in FIG. 3, wherein the power-gating transistor 22 regulates power to the buffer 20. FIG. 4 illustrates a circuit similar to the circuit of FIG. 3, except that the circuit of FIG. 4 includes two buffers 24,26, both regulated by a single power gating transistor 28. Using the prior art power-gate transistor design techniques described above, the gating transistor 28 of FIG. 4 may be designed with a capacity equal to twice that of the gating transistor 22 of FIG. 3, because the gating transistor 28 regulates power to twice as many transistors as the gating transistor 22.

Such a design approach, however, would be based on the assumption that all transistors of the circuit of FIG. 4 change state simultaneously, which in turn is based on the assumption that a first signal 30 that activates the first buffer 24 arrives simultaneously with a second signal 32 that activates the second buffer 26.

Due to the logical design of the circuit, input signal patterns, resistive and capacitive characteristics of the circuit and other factors, the first signal 30 and the second signal 32 may arrive at their respective buffers 24,26 at different times, and the difference in arrival time between the two may be significant. This difference in signal arrival time, hereinafter referred to as "δt" and so illustrated in FIG. 4, causes the transistors of the first buffer 24 to switch states before the transistors of the second buffer 26. Therefore, because the transistors of the first buffer 24 do not change state at the same time as the transistors of the second buffer 26, the gating transistor 28 need not have a capacity sufficient to meet the current demand of all the transistors of both buffers 24,26 in combination. Rather, the capacity of the gating transistor 28 only needs to be sufficient to meet the current demands of one of the buffers, such as the first buffer 24. If the first buffer 24 has a different number of transistors than the second buffer 26, the capacity of the gating transistor 28 would need to be sufficient to meet the current demands of the buffer with the greater number of transistors.

Thus, to determine an appropriate capacity of the gating transistor 28, one would need to consider not only a total capacity of the transistors in the block of design elements, but would further need to ascertain differences in arrival times (δt) of signals to various design elements—including upper and lower bounds of δt—based on a timing analysis for various input patterns, process/voltage/temperature conditions, and variations in device parameters.

Figure 5:
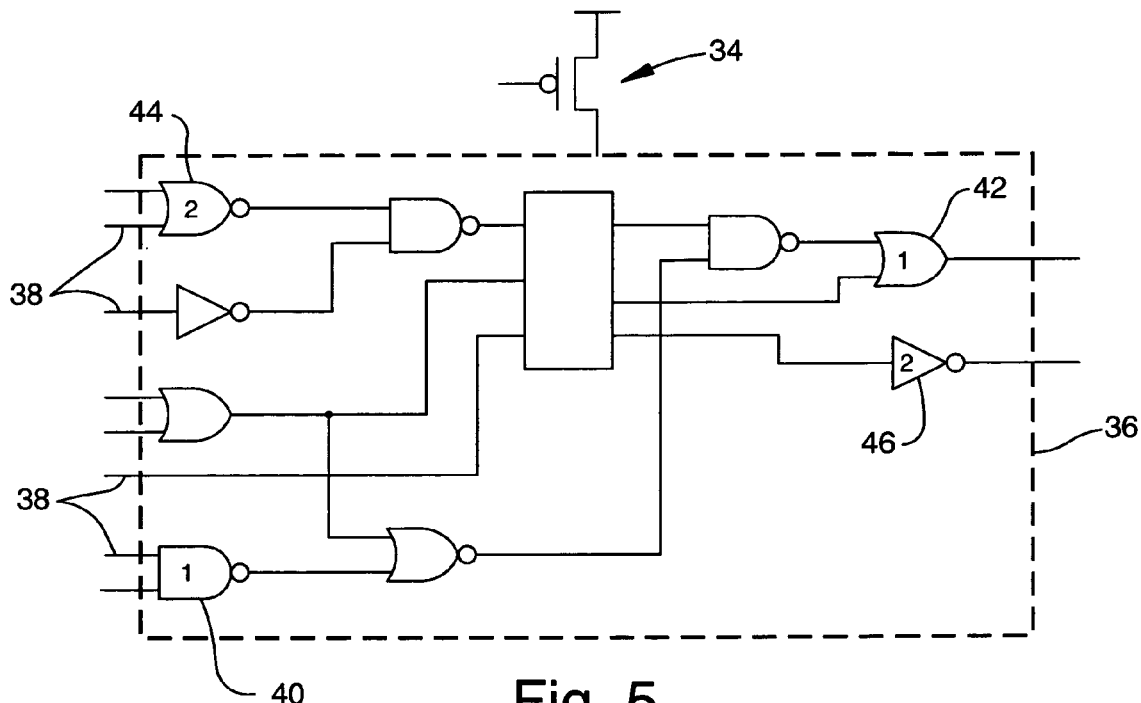
FIG. 5 is a circuit schematic diagram illustrating a power-gated circuit, wherein certain design elements of the circuit have been grouped according to a first method to determine a reduction in a capacity of the power-gating transistor.
Figure 7:
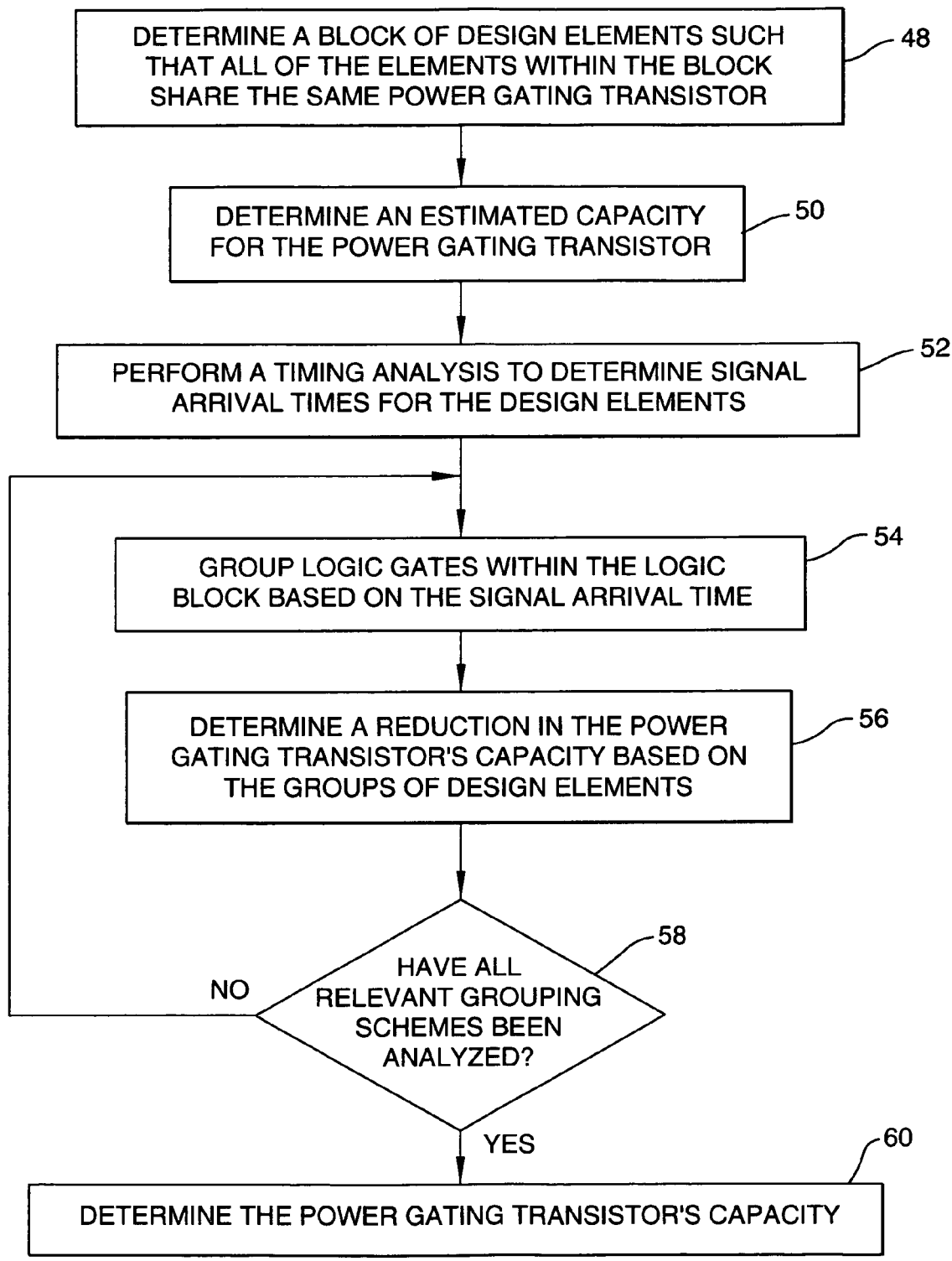
FIG. 7 is a flowchart of steps involved in a method of reducing leakage current in an electrical circuit according to the present invention.

The method of an embodiment of the present invention is particularly adapted for use with a more complex digital circuit, such as the circuit illustrated in FIG. 5. An exemplary method of determining a capacity of a power-gating transistor 34 of the circuit of FIG. 5 is shown in FIG. 7. First, a block of design elements 36 is determined such that all logic gates or other design elements in the block are regulated by the same power-gating transistor 34, as depicted in block 48 of FIG. 7. The block of design elements 36 may be similar to that of FIG. 5, wherein the block may include various logic gates, look-up tables, or other design elements. The block 36 is preferably chosen so that a single gating transistor 34 can regulate power flow to all of the design elements included in the block. Furthermore, the block may be chosen to facilitate a timing analysis used to determine a δt. If a particular group of signals, for example, are communicated only to a particular group of design elements, it may be desirable to include all of those design elements in a single block so that when the group of signals is inactive the block may "turned off," and further so that the timing associated with the group of signals may be used to determine one or more δts of the design block.

Once the design block 36 has been determined, an initial capacity of the power gating transistor 34 is estimated, as depicted in block 50. This initial estimate is merely a starting point intended to be refined, as explained below. The "capacity" of the gating transistor relates to the power regulated by the gating transistor. In the preferred embodiment, the gating transistor regulates the flow of electrical current to the block of design elements 36, and therefore the capacity of the gating transistor 34 includes a current flow capacity. In integrated circuits, the current capacity of a transistor is related to a width of the transistor, such as a physical width of a conductive element of the transistor. Thus, the initial capacity estimate may be a width of the gating transistor 34 that is equal to a total width of all transistors in the block of design elements 36. Furthermore, the initial estimated capacity may be adjusted according to a total number of "pull-up" transistors or a total number of "pull-down" transistors, as a maximum current flow through the pull-up transistors or the pull-down transistors will be indicative of a maximum current flow through the entire block.

After the initial, estimated capacity of the gating transistor 34 has been determined, a timing analysis is performed to determine a signal arrival time for each design element of the logic block 36, as depicted in block 52 of FIG. 7. This may be performed using a circuit analysis method known in the art, and may be performed using a computer or network of computers (for more complex circuits) or may be performed manually (for less complex circuits). The timing analysis is performed in two phases: a first phase determines when signals arrive at the input ports 38 of the design block, and a second phase determines a propagation delay of each signal between the input ports 38 of the block 36 and the inputs of each design element.

The first phase of the timing analysis may simply involve receiving predetermined signal timing information relating to the input ports 38 of the block 36 from, for example, a separate process such as a computer program or manual estimations. Alternatively, the first phase may involve calculating the signal timing information relating to the input ports 38 of the block 36 by, for example, analyzing characteristics of a circuit external to the design block 36. If the design block 36 is part of a larger integrated circuit design, the external circuit may simply be a portion of the larger circuit design. Furthermore, the external circuit may include one or more discrete circuit components external to an integrated circuit design, or may include an integrated circuit design to be implemented on a separate chip.

The second phase of the timing analysis involves calculating a propagation delay of each signal between the input ports 38 of the block 36 and the inputs of each design element. For example, a signal arriving at an input port 38 of the block 36 may arrive at a first logic gate 44, propagate through various other design elements, and ultimately arrive at a last logic gate 42. A propagation delay is calculated for each design element in the signal's path.

Thus, the timing analysis determines arrival times of signals to each design element of the design block 36. Using the arrival time information, the design elements of the design block are grouped according to their respective signal arrival times (54 in FIG. 7). In FIG. 5, for example, two groups of design elements are illustrated, wherein a first group is comprised of design elements 40, 42 labeled "1" and a second group is comprised of design elements 44,46 labeled "2." As illustrated, each group includes two design elements.

The groups are created so that the signal arrival time of a first element 40,44 in each group is different than a signal arrival time of a second element 42,46 in each group. In other words, the design elements of each group do not switch states simultaneously. By way of example, the first group consists of a first logic gate 40 and a second gate 42, wherein logic signals will always arrive at the first logic gate 40 before arriving at the second logic gate 42. Because the first logic gate 40 never switches states simultaneously with the second logic gate 42 in the first group, the gating transistor 34 need not have sufficient capacity to supply switching current to both logic gates 40,42, and its capacity may be reduced accordingly, as explained below.

The second group of FIG. 5 is similarly chosen to include two design elements 44,46 with distinct signal arrival times. Thus, each group identifies two design elements that do not switch states simultaneously, and therefore do not consume energy simultaneously. Because the gating transistor 34 will not supply both design elements simultaneously, the capacity of the gating transistor 34 may be reduced according to a demand of the design element that consumes less power (see 56 in FIG. 7). For example, if the first design element 40 of the first group consumes one microampere of current, and the second design element 42 of the first group consumes two microamperes of current, the capacity of the gating transistor 34 is reduced by one microampere. This is possible because the capacity of the gating transistor 34 was originally estimated to supply all design elements simultaneously, including both elements 40 and 42 of the first group. A similar approach is used to further reduce the capacity of the gating transistor 34 with respect to the second group of design elements.

In a more complex circuit, hundreds or thousands of groups may be formed, wherein the capacity of a gating transistor is reduced according to each group. In such circuits there may be many different ways to form the groups, therefore it is desirable to identify an optimal grouping scheme that maximizes the reduction in the gating transistor's capacity.

An optimal grouping scheme may be determined by repeating the process of grouping the elements, wherein each grouping scheme is different. A second grouping of the circuit of FIG. 5, for example, may include a first group consisting of design elements 40 and 46, and a second group consisting of design elements 44 and 42. The process is repeated in this manner until the capacity of the power gating transistor 34 cannot be further reduced. This point may be reached, for example, by recording a size of the power-gating transistor required for each combination of groups and cycling through every possible combination of groups to compare a capacity required for each (See 58 in FIG. 7).

According to an alternative grouping method, groups of three design elements are formed wherein each of the design elements has a different signal arrival time, so that only one of the elements will change state at any give time and the gating capacitor will only be required to supply power to one gating transistor at any given time. In this scenario, the capacity of the gating transistor—which was originally estimated to accommodate all three design elements simultaneously—may be reduced by an amount equal to the sum of the power capacities of the two design elements with the least power capacities of the three.

Figure 9:
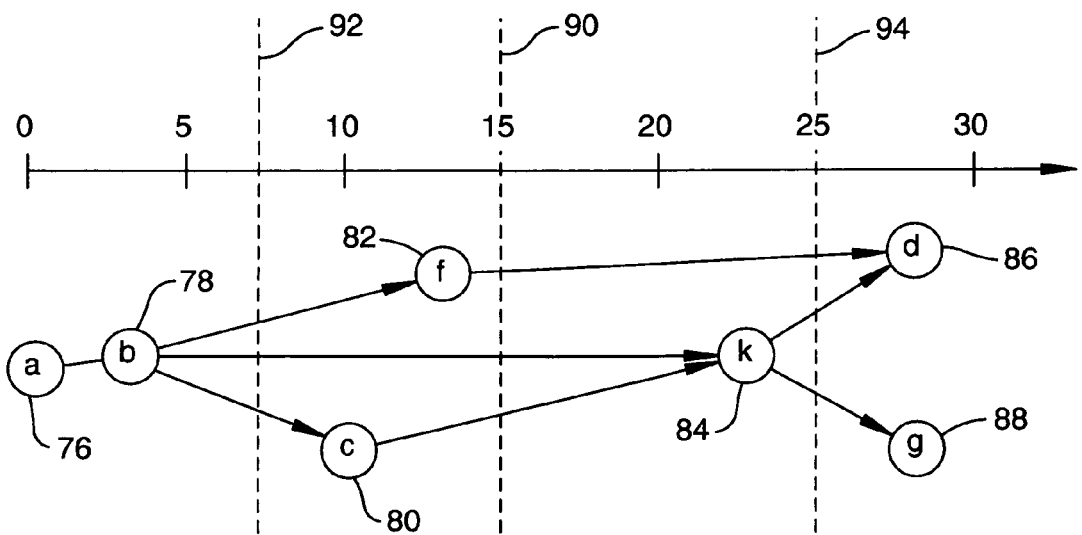
FIG. 9 is a graphical representation of the difference in signal arrival times between different circuit elements to be powered by one or more power-gating transistors.

This manner of grouping design elements is not limited to groups of just two or three elements, but may include any number of elements wherein each element has a distinct signal arrival time. For example, FIG. 9 shows a diagram that plots seven different circuit elements 76-88 on a graph. The delay in signal arrival time at the inputs of the different elements, measured in nano-seconds (ns), is shown on the horizontal axis. Thus, circuit element 76 receives its signal at time 0, and elements 86 and 88 receive simultaneous signals, but delayed by approximately 28 ns from the arrival time of the signal at element 76. Assuming a single power transistor will power each of the elements plotted on the graph, an iterative method may be employed to reduce the power transistor size (see also 60 in FIG. 7). A first partition 90 of the circuit elements into two groups is made roughly in the middle of the delay time between elements 76 and 86, 88, at 15 ns. Elements 76, 78, 80, 82 make up the first group. Elements 84, 86, 88 make up the second group. The power gate may now be reduced in size to supply the minimum power necessary for the group of the partition that consumes the most power. But the iterative process may continue, with a second partition 92 added between 5 and 10 ns on the graph. Now there are three groups, and the power gate may be further reduced in size to supply the minimum power necessary to power each group individually. A third partition 94 may then be added between element 84 and elements 86, 88, again allowing a further reduction of the power gate to the size necessary to power the largest (in power consumption) of the four existing groups.

This iterative process may continue and be repeated until there are no more partitions possible. Thus, elements 86 and 88 are depicted having each associated signal arrive at the same time. Thus, elements 86 and 88 cannot be placed in separate partitions. In practice, however, partitions can be created between elements that receive signals separated in time by less than one nano-second. As seen by the example of FIG. 9, a plurality of such groups may be formed, wherein different groups include different numbers of design elements.

Figure 6:
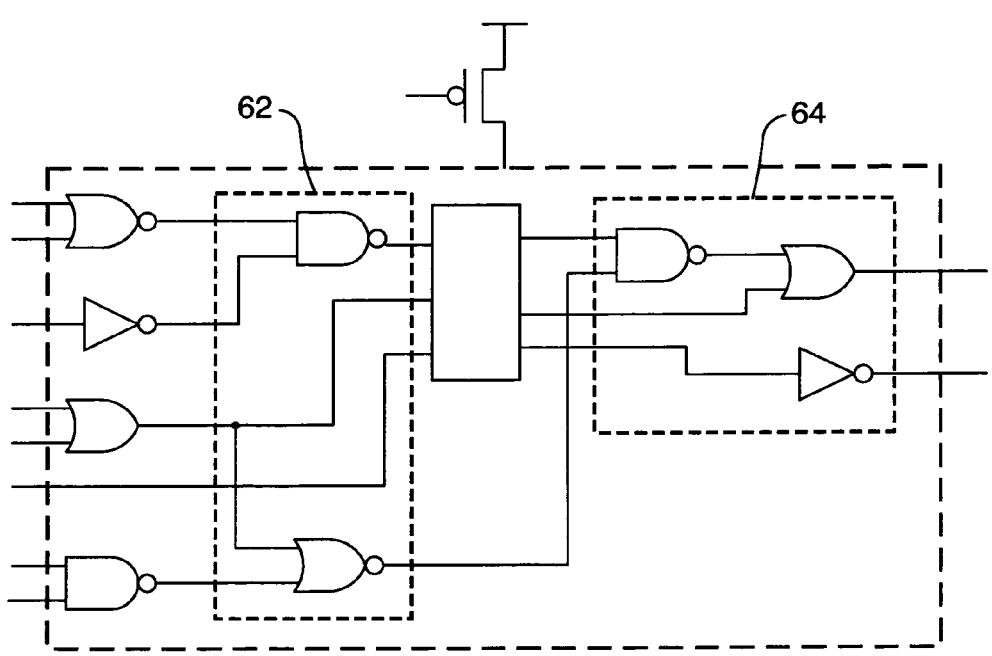
FIG. 6 is a circuit schematic diagram illustrating a power-gated circuit, wherein certain design elements of the circuit have been grouped according to a second method to determine a reduction in a capacity of the power-gating transistor.

According to yet another method of grouping the design elements, the elements are grouped according to signal arrival time so that all elements of each group have the same signal arrival time, and a first group of elements has a different signal arrival time than a second group of elements. With two separate groups thus created, the capacity of the power-gating transistor may then be reduced commensurately with the size of the groups. Referring now to FIG. 6, various design elements of the circuit have been grouped according to similar signal arrival times to form a first group 62 and a second group 64. If the first group 62 of design elements includes eight transistors, for example, and the second group 64 of design elements includes twelve transistors, the total number of transistors of the design block that may change state simultaneously is decreased by eight because the eight transistors of the first group 62 will never change state simultaneously with the twelve transistors of the second group 64.

Figure 8:
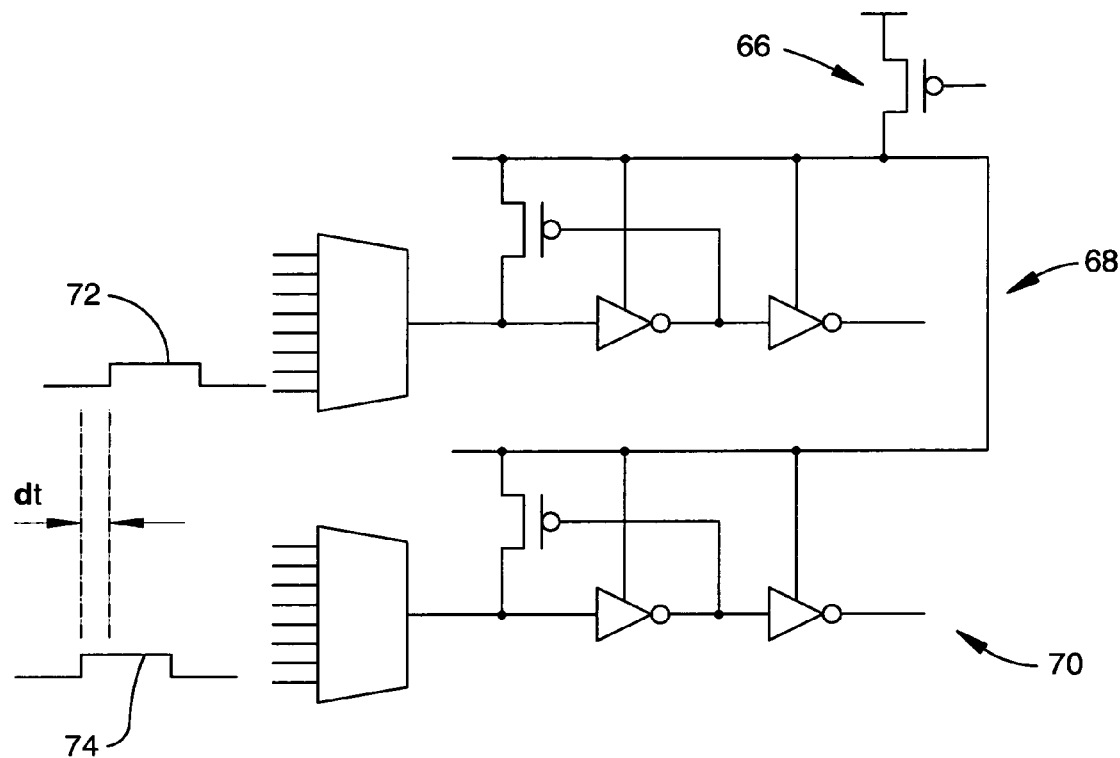
FIG. 8 is a circuit schematic diagram illustrating a power-gated FPGA circuit, wherein a power-gating transistor is connected to two programmable multiplexer circuits, and a difference in signal arrival times is represented by the symbol "δt".

The method set forth herein for reducing the leakage current of an integrated circuit is applicable across a broad range of devices and technologies, including, for example, application specific integrated circuits (ASICs), general application integrated circuits such as off the shelf computer processors and chipsets, and programmable logic devices such as complex programmable logic devices (CPLDs) and field-programmable gate arrays (FPGAs). FIG. 8, for example, illustrates an exemplary implementation of the present invention in an FPGA, wherein a power-gating transistor 66 regulates power to two programmable multiplexer circuits 68,70 that form part of a switch block. A capacity of the gating transistor 66 is based on a difference in arrival time of input signals 72,74, wherein the capacity of the gating transistor 66 is less than a total demand of all primitive elements comprising the multiplexer circuits 68,70.

Other aspects and embodiments of the present invention will be apparent to those skilled in the art from consideration of the specification and practice of the invention disclosed herein. It is intended that the specification and disclosed embodiments be considered as examples only, with a true scope and spirit of the invention being indicated by the following claims.

What is claimed is:

1. A computer-readable medium with computer-readable instructions written thereon for implementing a method of reducing leakage current in an integrated circuit, the method comprising:

determining a block of logic gates within an integrated circuit such that all logic gates in the block are connected to a single power-gating transistor;

estimating a maximum width of the power-gating transistor based on a maximum power consumption of the block of logic gates;

determining a signal arrival time for each of a plurality of logic gates of the block;

determining a plurality of groups of logic gates within the block according to a first grouping scheme, wherein each group is formed based on signal arrival times;

determining a first reduction amount representing a maximum amount the width of the gating transistor is enabled to be reduced based on the first grouping scheme;

determining a plurality of groups of logic gates within the block according to a second grouping scheme, wherein each group is formed based on signal arrival times;

determining a second reduction amount representing a maximum amount the width of the gating transistor is enabled to be reduced based on the second grouping scheme; and reducing the estimated maximum width of the power-gating transistor by an amount equal to the greater of the first reduction amount or the second reduction amount.

2. The computer-readable medium as set forth in claim 1, the estimating step further comprising:

estimating the maximum width based on a total width of all pull-up transistors in the block of logic gates.

3. The computer-readable medium as set forth in claim 1, the estimating step further comprising:

estimating the maximum width based on a total width of all pull-down transistors in the block of logic gates.

4. The computer-readable medium as set forth in claim 1, the step of determining a plurality of groups of logic gates further comprising:

determining the plurality of groups such that each element of each group has a different signal arrival time than other elements of the group.

5. The computer-readable medium as set forth in claim 1, the step of determining a plurality of groups of logic gates within the block according to a first grouping scheme further comprising:

the step of determining the plurality of groups such that all elements of each group have similar signal arrival times.

6. A method of reducing leakage current in an integrated circuit by determining a width of a power-gating transistor based on delay statistics, the method comprising the steps of:

determining a block of logic gates within an integrated circuit such that all logic gates in the block are connected to a single power-gating transistor;

estimating a maximum width of the power-gating transistor based on a maximum power consumption of the block of logic gates;

determining a signal arrival time for each of a plurality of logic gates of the block;

determining a plurality of groups of logic gates within the block according to a first grouping scheme, wherein each group is formed based on signal arrival times;

determining a first reduction amount representing a maximum amount the width of the gating transistor is enabled to be reduced based on the first grouping scheme;

determining a plurality of groups of logic gates within the block according to a second grouping scheme, wherein each group is formed based on signal arrival times;

determining a second reduction amount representing a maximum amount the width of the gating transistor is enabled to be reduced based on the second grouping scheme; and reducing the estimated maximum width of the power-gating transistor by an amount equal to the greater of the first reduction amount or the second reduction amount.

7. The method as set forth in claim 6, the estimating step, further comprising the step of estimating the maximum width based on a total width of all pull-up transistors in the block of logic gates.

8. The method as set forth in claim 6, the estimating step, further comprising the step of estimating the maximum width based on a total width of all pull-down transistors in the block of logic gates.

9. The method as set forth in claim 6, step of determining a plurality of groups of logic gates within the block according to a first grouping scheme, further comprises the step of determining the plurality of groups such that each element of each group has a different signal arrival time than other elements of the group.

10. The method as set forth in claim 6, step of determining a plurality of groups of logic gates within the block according to a first grouping scheme, further comprises the step of determining the plurality of groups such that all elements of each group have similar signal arrival times.

\* \* \* \* \*